United States Patent
Zhu et al.

(10) Patent No.: US 10,096,717 B2
(45) Date of Patent: Oct. 9, 2018

(54) MOSFET AND METHOD FOR MANUFACTURING THE SAME

(75) Inventors: Huilong Zhu, Poughkeepsie, NY (US); Qingqing Liang, Lagrangeville, NY (US); Haizhou Yin, Poughkeepsie, NY (US); Zhijiong Luo, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 13/510,407

(22) PCT Filed: Nov. 18, 2011

(86) PCT No.: PCT/CN2011/082417
§ 371 (c)(1),
(2), (4) Date: May 17, 2012

(87) PCT Pub. No.: WO2013/053167
PCT Pub. Date: Apr. 18, 2013

(65) Prior Publication Data
US 2013/0093002 A1    Apr. 18, 2013

(30) Foreign Application Priority Data
Oct. 12, 2011    (CN) .......................... 2011 1 0308827

(51) Int. Cl.
*H01L 21/336* (2006.01)
*H01L 29/786* (2006.01)
(Continued)

(52) U.S. Cl.
CPC .. *H01L 29/78648* (2013.01); *H01L 29/66772* (2013.01); *H01L 21/2652* (2013.01);
(Continued)

(58) Field of Classification Search
CPC .............................. H01L 21/336; H01L 29/78
(Continued)

(56) References Cited

U.S. PATENT DOCUMENTS 5,877,049 A * 3/1999 Liu et al. ...................... 438/224
6,043,535 A * 3/2000 Houston ....................... 257/345
(Continued)

FOREIGN PATENT DOCUMENTS

CN    101958327 A    1/2011

OTHER PUBLICATIONS

"International Application Serial No. PCT/CN2011/082417, International Search Report dated Jul. 19, 2012", 6 pgs.
(Continued)

*Primary Examiner* — Joseph C Nicely
*Assistant Examiner* — Lamont Koo
(74) *Attorney, Agent, or Firm* — Schwegman Lundberg & Woessner, P.A.

(57) ABSTRACT

The present disclosure discloses a MOSFET and a method for manufacturing the same, wherein the MOSFET comprises: an SOI wafer comprising a semiconductor substrate, a buried insulating layer on the semiconductor substrate, and a semiconductor layer on the buried insulating layer; a gate stack on the semiconductor layer; a source region and a drain region in the semiconductor layer on both sides of the gate stack; and a channel region in the semiconductor layer and located between the source region and the drain region, wherein the MOSFET further comprises a back gate which is located in the semiconductor substrate and has a first doped region as a lower portion of the back gate and a second doped region as an upper portion of the back gate, and the second doped region of the back gate is self-aligned (Continued)

with the gate stack. The MOSFET can adjust a threshold voltage by changing doping type and doping concentration of the back gate.

8 Claims, 8 Drawing Sheets

(51) Int. Cl.
    *H01L 21/265*     (2006.01)
    *H01L 29/66*     (2006.01)
    *H01L 21/74*     (2006.01)

(52) U.S. Cl.
    CPC .......... *H01L 21/2658* (2013.01); *H01L 21/74* (2013.01); *H01L 29/66545* (2013.01)

(58) Field of Classification Search
    USPC ........... 257/329, E29.262, E21.444; 438/306
    See application file for complete search history.

(56) References Cited

U.S. PATENT DOCUMENTS

| | | | |
|---|---|---|---|
| 6,100,567 A * | 8/2000 | Burr | 257/365 |
| 6,348,372 B1 * | 2/2002 | Burr | H01L 21/761 |
| | | | 257/E21.544 |
| 2002/0063285 A1 | 5/2002 | Wu et al. | |
| 2008/0042205 A1 * | 2/2008 | Nowak | 257/351 |
| 2011/0241157 A1 * | 10/2011 | Mazure et al. | 257/506 |
| 2011/0316083 A1 * | 12/2011 | Cheng et al. | 257/365 |

OTHER PUBLICATIONS

"international Application Serial No. PCT/CN2011/082417, Written Opinion dated Jul. 19, 2012", 4 pgs.

"Chinese Application No. 201110308827.5, Office Action dated Dec. 2, 2014", 12 pgs.

\* cited by examiner

MOSFET AND METHOD FOR MANUFACTURING THE SAME

This application is a National Phase application of, and claims priority to, PCT Application No. PCT/CN2011/082417, filed on Nov. 18, 2011, entitled MOSFET AND METHOD FOR MANUFACTURING THE SAME, which claimed priority to Chinese Application No.201110308827.5, filed on Oct. 12, 2011. Both the PCT Application and Chinese Application are incorporated herein by reference in their entireties.

TECHNICAL FIELD

The present disclosure relates to a MOSFET and a method for manufacturing the same, and in particular, to a MOSFET with a back gate and a method for manufacturing the same.

BACKGROUND

An important trend in development of semiconductor technology is scaling down of metal-oxide-semiconductor field effect transistors (MOSFETs) for improving integration level and reducing manufacturing cost. However, it is well known that short channel effects arise as the size of MOSFETs decreases. As the MOSFETs are scaled down, a gate also has a reduced effective length and actually controls fewer charges in a depletion region when a gate voltage is applied. Consequently, a threshold voltage of the MOSFETs drops with a reduced channel length.

In the MOSFETs, it may be desirable on the one hand that the threshold voltage of the semiconductor device is increased to suppress the short channel effects, and on the other hand that the threshold voltage of the semiconductor device is decreased to reduce power consumption in a low supply voltage application, or in an application using both P-type and N-type MOSFETs.

Channel doping is a known approach of tuning the threshold voltage. However, if the threshold voltage of the semiconductor device is raised by increasing a doping concentration in a channel region, mobility of carriers drops, which results in degradation of the device performance. Moreover, ions with a high doping concentration in the channel region may neutralize ions in source/drain regions and ions in regions which adjoin the channel region, which decreases a doping concentration in the region adjacent to the channel region and increases resistance of the device.

The short channel effects can be suppressed by providing a ground plane (i.e. a grounded back gate) beneath a buried insulating layer. However, an integrated circuit may comprise MOSFETs with different gate lengths. Although a high doping concentration in a back gate may be beneficial for the MOSFET with a short gate length for suppressing the short channel effects, it causes an excessively high threshold voltage for the MOSFET with a long gate length. It is desirable that the threshold voltage is adjusted differently for the MOSFETs with different gate lengths.

Therefore, it is still desirable that the threshold voltage of the semiconductor device is adjusted in a controllable manner without increasing the doping concentration in the channel region, while the performance of the semiconductor device is not deteriorated.

SUMMARY OF THE DISCLOSURE

The object of the present disclosure is to provide a MOSFET having a threshold voltage adjustable by a back gate. According to one aspect of the present disclosure, there is provided a MOSFET comprising an SOI wafer comprising a semiconductor substrate, a buried insulating layer on the semiconductor substrate, and a semiconductor layer on the buried insulating layer; a gate stack on the semiconductor layer; a source region and a drain region in the semiconductor layer on both sides of the gate stack; and a channel region in the semiconductor layer and located between the source region and the drain region, wherein the MOSFET further comprises a back gate which is located in the semiconductor substrate and has a first doped region as a lower portion of the back gate and a second doped region as an upper portion of the back gate, and the second doped region of the back gate is self-aligned with the gate stack.

According to another aspect of the present disclosure, there is provided a method for manufacturing a MOSFET, comprising: providing an SOI wafer comprising a semiconductor substrate, a buried insulating layer on the semiconductor substrate, and a semiconductor layer on the buried insulating layer; performing a first ion implantation to form a first doped region of a back gate in the semiconductor substrate; forming a dummy gate on the semiconductor layer; performing a source/drain ion implantation to form a source region and a drain region in the semiconductor layer; removing the dummy gate to form a gate opening; performing a second ion implantation through the gate opening to form a second doped region of the back gate in the semiconductor substrate so that the first doped region and the second doped region constitute a lower portion and an upper portion of the back gate respectively; and forming a gate stack in the gate opening.

The MOSFET according to the present disclosure comprises the back gate formed in the semiconductor substrate. When applying a bias voltage to the back gate, a bias electric field is applied to the channel region through the buried insulating layer. The MOSFET can adjust a threshold voltage by changing doping type and doping concentration of the back gate. Moreover, the second doped region of the back gate is self-aligned with the gate stack. Consequently, the back gate is close to the channel region below the channel region, but far away from the source/drain regions. On the one hand, strong capacitive coupling between the back gate and the channel region enhances an effect of adjusting the threshold voltage. On the other hand, a parasitic capacitance between the back gate and the source/drain regions is decreased, which improves performance of the semiconductor device.

In a preferable embodiment, the anti-doped region having the doping type opposite to that of the back gate is formed and facilitates adjusting a doping profile of the back gate by the anti-doped region (for example, by lowering the doping concentration of the portion of the back gate overlapping the anti-doped region), which in turn facilitates adjusting the threshold voltage of the semiconductor device.

Moreover, a plurality of MOSFETs on a semiconductor substrate may be provided with a common back gate and a common contact for the back gate to have a footprint smaller than that of the MOSFETs provided with respective back gates and respective contacts for the back gates.

DETAILED DESCRIPTION

Exemplary embodiments of the present disclosure will be described in more details below with reference to the accompanying drawings. For the sake of clarity, various components in the attached drawings are not drawn to scale.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure. Unless the context clearly indicates otherwise, each part of the semiconductor device can be made of material(s) well known to one skilled person in the art.

In the present application, the term "semiconductor structure" means generally the whole semiconductor structure formed at each step of the method for manufacturing the semiconductor device, including all of the layers and regions having been formed.

According to the first embodiment of the present disclosure, the steps shown in FIGS. 1 to 13 are performed for manufacturing a MOSFET.

Figure 1:
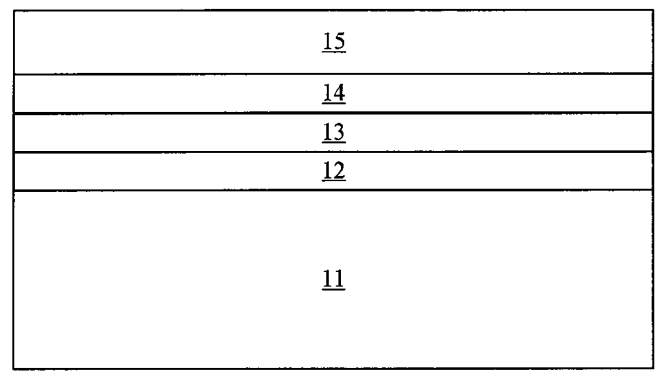
FIGS. 1-13 schematically show cross-sectional views of the semiconductor structure at various stages in a first embodiment of the method for manufacturing a MOSFET according to the present disclosure.

As shown in FIG. 1, an SOI wafer is used as an initial structure of the semiconductor substrate, comprising a semiconductor substrate 11, a buried insulating layer 12 and a semiconductor layer 13, from bottom to top. The semiconductor layer 13 may have a thickness of about 5 nm to about 20 nm, such as 10 nm or 15 nm. Moreover, the buried insulating layer 12 may have a thickness of about 5 nm to about 30 nm, such as 10 nm, 15 nm, 20 nm or 25 nm.

A portion of the semiconductor substrate 11 will be used as a back gate for the MOSFET. The semiconductor substrate 11 may be made of bulk silicon, Group IV semiconductor materials (such as SiGe or Ge), or Group III-V semiconductor materials (such as GaAs).

The buried insulating layer 12 may be one of a buried oxide layer, a buried oxynitride layer, and any other buried insulating layer.

The semiconductor layer 13 will be used for providing a source region, a drain region and a channel region of the MOSFET. The semiconductor layer 13 may be made of a semiconductor material selected from the group consisting of group-IV semiconductor (such as Si, Ge or SiGe) and group III-V compound semiconductor (such as GaAs). In the present embodiment, the semiconductor layer 13 may be monocrystalline silicon or SiGe.

The process for providing an SOI wafer is well known in the art. For example, a SmartCut™ process (referred as "Smart Cut" or "Smart Strip") can be used for this purpose. The SmartCut™ process comprises the steps of bonding two wafers with each other, each of which has a surface oxide layer formed by thermal oxidation or deposition, and one of which is subjected to hydrogen implantation so as to form a hydrogen implantation region at a predetermined depth in the silicon body below the surface oxide layer; converting the hydrogen implantation region to a layer having microcavities for subsequent separation, under the conditions of an increased pressure and an increased temperature; and separating one of the two wafers from the other of the two wafers. The wafer including a surface oxide layer bonded with the semiconductor substrate is used as an SOI wafer. By controlling process parameters in the thermal oxidation or in the deposition, a thickness of the buried insulating layer in the SOI wafer can be changed. By controlling implantation energy during the hydrogen implantation, a thickness of the semiconductor layer in the SOI wafer can be varied.

An oxide protection layer 14 having a thickness of about 5 nm to about 20 nm is then formed on the SOI wafer, for example, by sputtering or thermal oxidation. A nitride protection layer 15 having a thickness of about 30 nm to about 100 nm is then formed on the oxide protection layer 14, for example, by sputtering.

Figure 2:
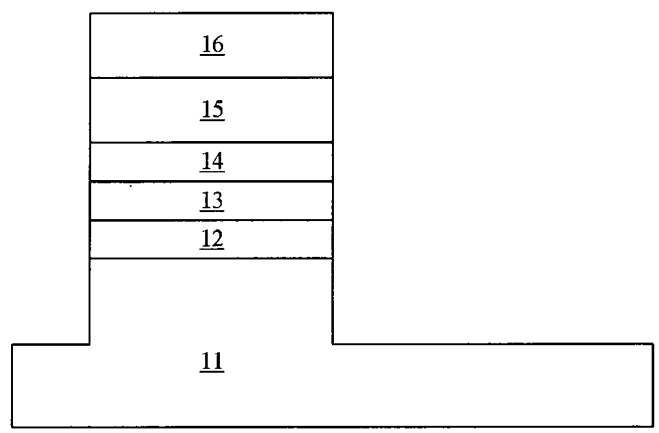

Next, the above semiconductor structure is patterned to form a trench, as shown in FIG. 2.

The patterning process may involve the following steps: a photoresist mask 16 having a pattern therein is formed on the nitride protection layer 15, by a conventional lithographical process including exposure and development steps; exposed portions of the nitride protection layer 15, the oxide protection layer 14, the semiconductor layer 13 and the buried insulating layer 12 are removed from top to bottom by dry etching such as ion beam milling, plasma etching, reactive ion etching, laser ablation and the like, or wet etching using a solution of etchant; and the photoresist mask 16 is then removed by ashing or dissolution with a solvent. During the pattering process, a portion of the semiconductor substrate 11 is also removed to form a trench having a predetermined depth (for example, in the range of about 20 nm to about 100 nm).

Figure 3:
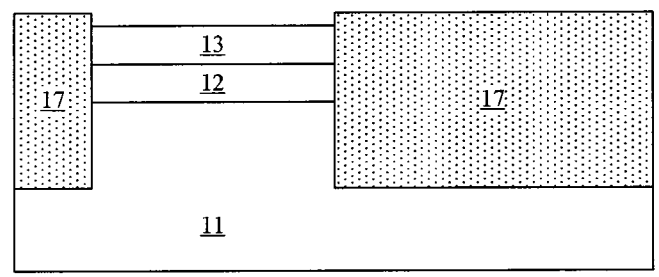

Next, an oxide is deposited on the whole surface of the above semiconductor structure, for example, by sputtering. The oxide fills up the trench. The surface of the semiconductor structure is planarized by chemical mechanical polishing (CMP). The CMP stops at the top of the nitride protection layer 15, and removes the oxide outside of the trench. A portion of oxide remains in the trench and forms a shallow trench isolation (STI) 17 which defines an active region of the MOSFET. The oxide in the STI 17 is etched back to expose a portion of side surfaces of the nitride protection layer 15. Next, the nitride protection layer 15 is selectively removed with respect to oxides, for example, by wet etching using hot phosphoric acid. Further, the oxide protection layer 14 is removed by dry etching such as ion beam milling, plasma etching, reactive ion etching, laser ablation and the like, or wet etching using a solution of etchant, to expose the semiconductor layer 14, as shown in FIG. 3.

When the oxide protection layer 14 is removed, the oxide in the STI 17 is also etched to the same extent. However, the oxide in the STI 17 is not over etched because an etching time is accurately controlled. The remaining oxide in the STI 17 has a top surface at least higher than the exposed top surface of the semiconductor layer 13.

Figure 4:
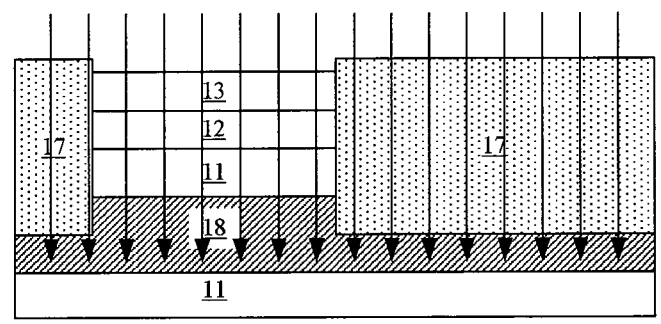

Next, a first ion implantation for a back gate is performed on the semiconductor substrate 11, as shown in FIG. 4. Because a total thickness of the semiconductor layer 13 and the buried insulating layer 12 is only about 10 nm to about 50 nm, implanted ions easily penetrate these layers and reach the semiconductor substrate 11. A depth of implantation is controlled by changing implantation energy and dose, so that implanted ions are distributed mainly in the semiconductor substrate 11.

The first ion implantation for the back gate is a deep ion implantation such that the first doped region 18 occupies at least a lower portion of the back gate to be formed. The first doped region 18 may be distributed in an upper portion of the semiconductor substrate 11 and adjoins the buried insulating layer 12. Alternatively, the first doped region 18 is separated from the above buried insulating layer 12 at a certain distance and does not adjoin it directly (not shown).

Dopants in the first ion implantation for the back gate may be either of N-type or of P-type. The type of the dopants may be opposite to the type of the MOSFET in order to increase the threshold voltage of the MOSFET, i.e. P-type for an N-type MOSFET, or N-type for a P-type MOSFET. The type of the dopants may be the same as the type of the MOSFET in order to decrease the threshold voltage of the MOSFET.

As P-type dopants, boron (B or $BF_2$), Indium (In) or a combination thereof may be used. As N-type dopants, arsenic (As), phosphor (P) or a combination thereof may be used.

In the first ion implantation for the back gate, a dose of the dopants can be determined according to technological level and product requirements, and may be, for example, about $1\times10^{13}$ $cm^{-2}$ to about $1\times10^{15}$ $cm^{-2}$. Consequently, the first impanation region 18 has a doping concentration of about $1\times10^{17}$ $cm^{-3}$ to about $1\times10^{20}$ $cm^{-3}$.

Figure 5:
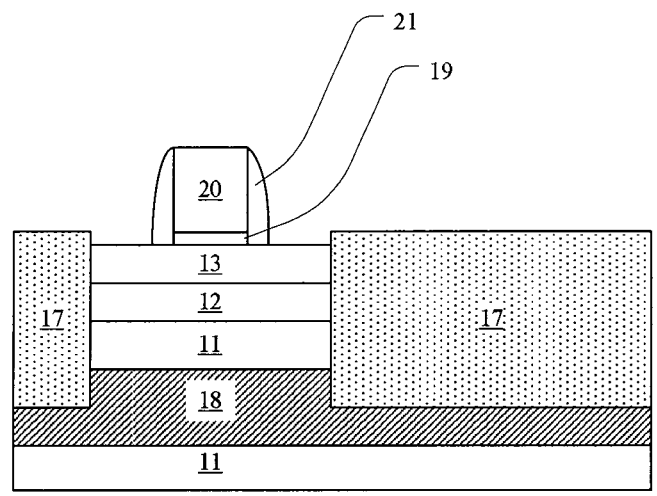

Next, a dummy gate stack and its sidewall spacers 21 are formed on the semiconductor layer 13, as shown in FIG. 5. The dummy gate stack may comprise a gate dielectric layer 19 and a dummy gate 20. The gate dielectric layer 19 may have a thickness of about 1 nm to about 4 nm, and the dummy gate 20 may have a thickness of about 30 nm to about 100 nm. Alternatively, the gate dielectric layer 19 may not be included in the dummy gate stack. Deposition processes and patterning processes for forming the gate stack and the sidewall spacers 21 are known in the art. The dummy gate 20 is typically patterned into a stripe shape.

The gate dielectric layer 19 may be made of one of oxides, oxynitrides and high-K materials (such as, one of $HfO_2$, HfSiO, HfSiON, HfTaO, HfTiO, HfZrO, $Al_2O_3$, $La_2O_3$, $ZrO_2$ and LaAlO, or any combination thereof), or any combination thereof. The dummy gate 20 may be of a metal layer, a doped polysilicon layer, or a stack of a metal layer and a doped polysilicon layer. Alternatively, the dummy gate 20 may comprise an insulating material, such as silicon oxide, silicon oxynitride or silicon nitride.

The channel region comprises the portion (not shown) of the semiconductor layer 13 below the gate stack, and is preferably undoped or self-doped or doped in a previous independent ion implantation process.

Next, an source/drain ion implantation is performed on the semiconductor layer 13 to form source/drain regions (not shown) on both sides of the dummy gate stack in a self-aligned manner. A depth of implantation is controlled by changing implantation energy and dose, so that the implanted ions are distributed mainly in the semiconductor layer 13.

Preferably, a rapid anneal is performed after the source/drain ion implantation, which is also known as spike anneal, for example, by using laser, electron beam or infrared radiation, so as to repair damages in the lattice and activate the implanted dopants.

Figure 6:
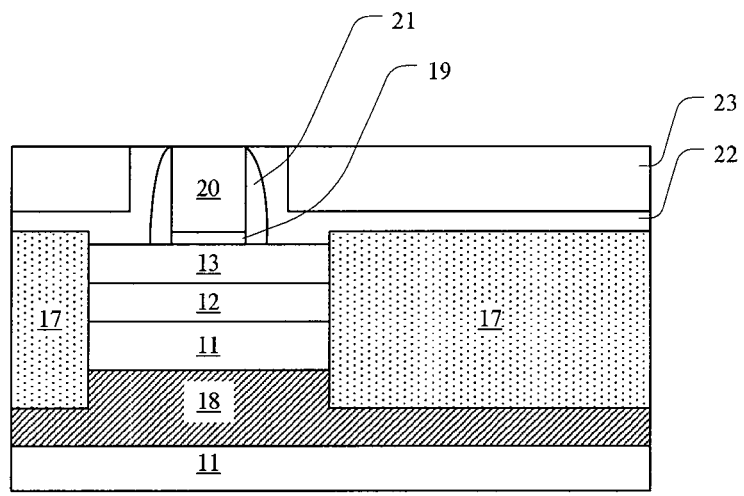

Next, a nitride layer 22 is formed on the whole surface of the semiconductor structure to have a thickness of about 5 nm to about 15 nm, for example, by sputtering; and an oxide layer 23 is formed on the nitride layer 22 to have a thickness of about 50 nm to about 100 nm, for example, by sputtering or thermal oxidation. The surface of the semiconductor structure is planarized by chemical mechanical polishing (CMP). The CMP stops at the surface of the dummy gate 20 and exposes the surface of the dummy gate 20, as shown in FIG. 6.

Figure 7:
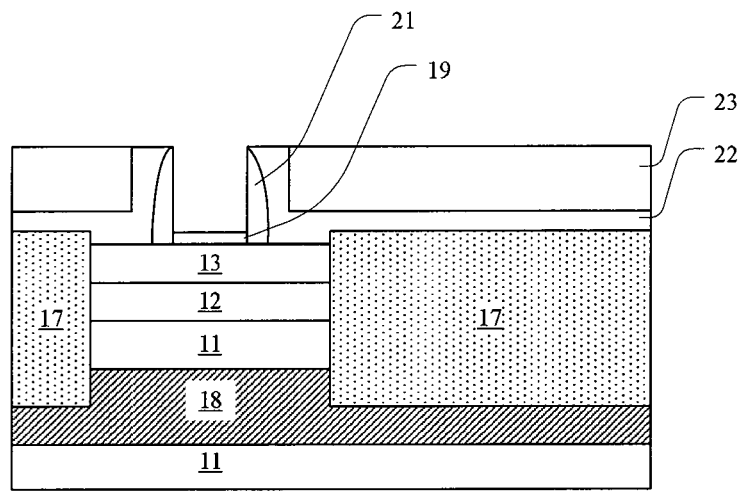

The nitride layer 22 and the oxide layer 23 together serve as an interlayer dielectric layer of the MOSFET. Next, the dummy gate 20 is selectively removed to form a gate opening having a width L, by wet etching or dry etching, with the nitride layer 22 and the oxide layer 23 together as a hard mask. The portion of the gate dielectric layer 19 under the dummy gate 20 is exposed, as shown in FIG. 7. Alternatively, the gate dielectric layer 19 may also be removed. In a case that the gate dielectric layer 19 is kept, the gate dielectric layer 19 will be used in a subsequent ion implantation process as a protection layer for the ion implantation to reduce damages to the semiconductor substrate 11 due to the ion implantation operation.

Figure 8:
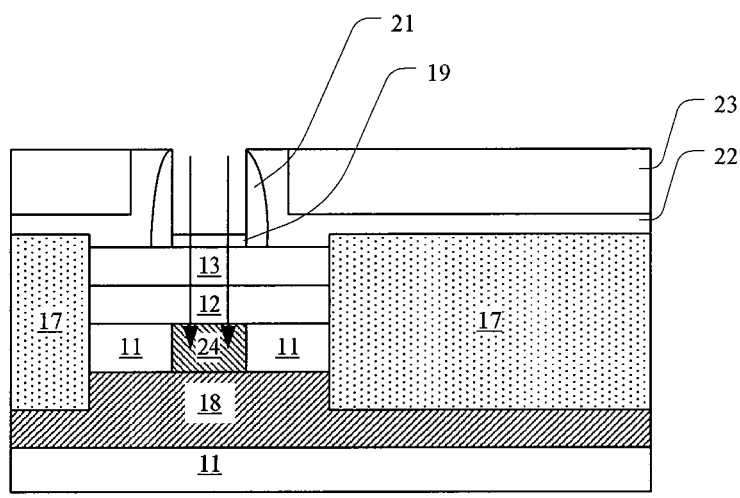

Next, a second ion implantation for the back gate is performed on the semiconductor substrate 11 through the gate opening, as shown in FIG. 8. Because a total thickness of the gate dielectric layer 19, the semiconductor layer 13 and the buried insulating layer 12 is only about 10 nm to about 50 nm, implanted ions easily penetrate these layers and reach the semiconductor substrate 11. A depth of implantation is controlled by changing implantation energy and dose, so that the implanted ions are distributed mainly in the semiconductor substrate 11.

Compared with the first ion implantation for the back gate, the second ion implantation for the back gate is a shallow ion implantation such that a second doped region 24 occupies at least an upper portion of the back gate to be formed. The second doped region 24 may be distributed above the first doped region 18 and occupies an upper portion of the semiconductor substrate 11. Furthermore, the second doped region 24 may adjoin the buried insulating layer 12, as shown in FIG. 8. Alternatively, the second doped region 24 is separated from the above buried insulating layer 12 at a certain distance and does not adjoin it directly (not shown).

The first doped region 18 and the second doped region 24 adjoin (or even overlaps) each other, and together constitute a back gate having an uneven doping concentration.

A type of dopants in the second ion implantation for the back gate may be the same as that of dopants in the first ion implantation for the back gate. A dose of the dopants can be determined according to technological level and product requirements, and may be, for example, about $1\times10^{13}$ $cm^{-2}$ to about $1\times10^{15}$ $cm^{-2}$. Consequently, the second impanation region 24 has a doping concentration of about $1\times10^{17}$ $cm^{-3}$ to about $1\times10^{20}$ $cm^{-3}$.

The second doped region 24 of the back gate is formed in a self-aligned manner. Consequently, the back gate is formed to be close to the channel region below the channel region, but far away from the source/drain regions. On the one hand, strong capacitive coupling between the back gate and the channel region enhances an effect of adjusting the threshold voltage. On the other hand, a parasitic capacitance between the back gate and the source/drain regions is decreased, which improves performance of the semiconductor device. Preferably, a rapid anneal may be performed after the second ion implantation for the back gate, which is also known as spike anneal, for example, by using laser, electron beam or infrared radiation, so as to repair damages in the lattice and activate the implanted dopants.

Next, a new high-K dielectric layer 25 is formed at the bottom and on an inner wall of the gate opening. The high-K dielectric layer 25 may be made of one of $HfO_2$, HfSiO, HfSiON, HfTaO, HfTiO, HfZrO, $Al_2O_3$, $La_2O_3$, $ZrO_2$ and LaAlO, or any combination thereof. The high-K dielectric layer 25 may have a thickness of about 1 nm to about 3 nm.

A replacement gate material (for example, the above metal for forming the dummy gate 20) is then deposited on the whole surface of the semiconductor structure. The replacement gate material should have a thickness sufficient for filling up the gate opening.

Figure 9:
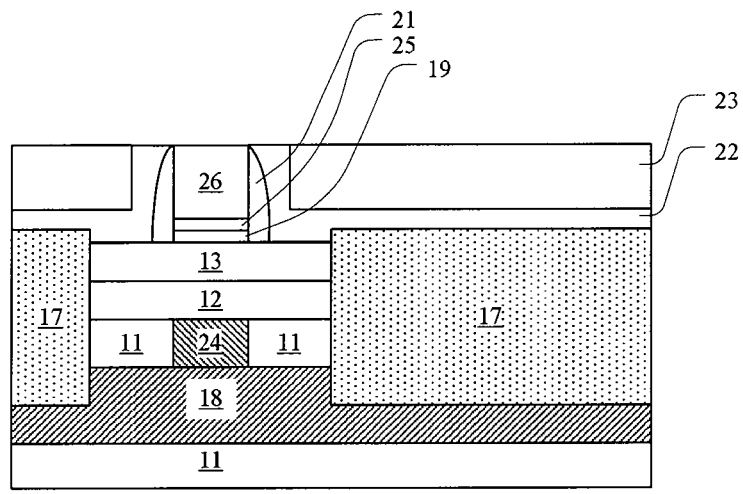

Next, CMP is performed on the replacement gate material to obtain a flat structure surface. In the present application, the term "flat", "planar" or "flush" means that a height difference between any two points in a plane is within a process tolerance. During the CMP, the previously formed interlayer dielectric layer is used as a stop layer such that the portion of the replacement gate material outside the gate opening can be removed completely. The remaining portion of the replacement gate material in the gate opening forms a replacement gate 26 as shown in FIG. 9.

Preferably, the gate dielectric layer 19 may also be removed after the second ion implantation for the back gate, if required.

Further preferably, after the new high-K dielectric layer 24 is formed, a threshold adjustment layer (for example, TiN, TaN, TiAlN, and TaAlN) is formed in the gate opening before filling the replacement gate material.

Figure 10:
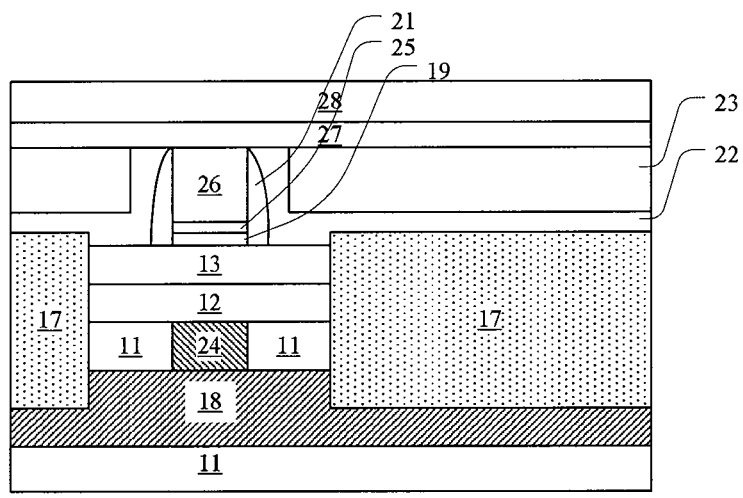

Next, a nitride layer 27 is formed on the whole surface of the semiconductor structure to have a thickness of about 5 nm to about 20 nm, for example, by sputtering; and an oxide layer 28 is formed on the nitride layer 27 to have a thickness of about 10 nm to about 50 nm, for example, by sputtering or thermal oxidation, as shown in FIG. 10.

The nitride layer 27, the oxide layer 28, the previous nitride layer 22 and the previous oxide layer 23 together serve as an interlayer dielectric layer of the MOSFET.

Figure 11:
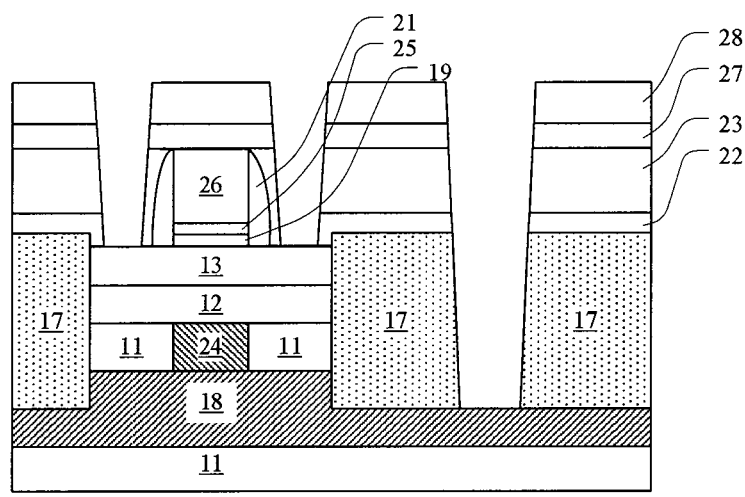

Next, via holes are formed through the interlayer dielectric layer to reach the source/drain regions, and through the interlayer dielectric layer and the shallow trench isolation to reach the first doped region 18 of the back gate, as shown in FIG. 11.

Figure 12:
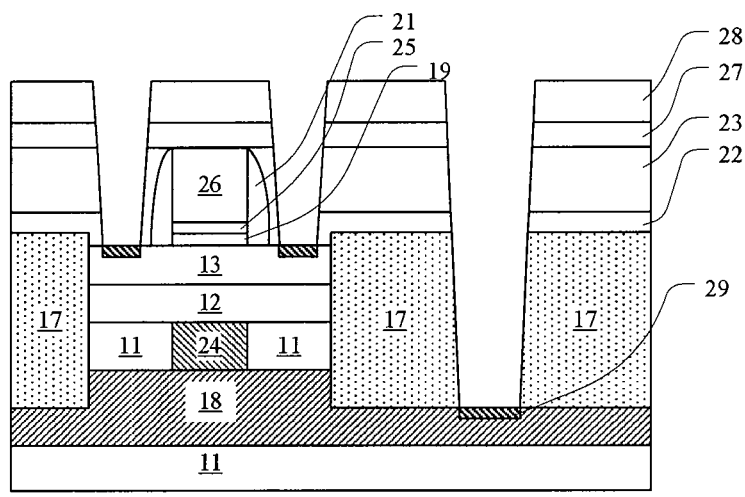

Next, a silicidation process is performed to form silicides 29 at the exposed top surfaces of the first doped region 18 of the back gate and the source/drain regions, as shown in FIG. 12.

The silicidation process is well known, for example, comprising the steps of conformally forming an Ni layer and a Pt layer in sequence by the above-mentioned deposition process; performing an annealing treatment at a temperature of about 300-500° C. so that the deposited Ni and Si react with each other to form NiPtSi; and finally, selectively removing the un-reacted Ni and Pt with respect to the silicide by wet etching.

Figure 13:
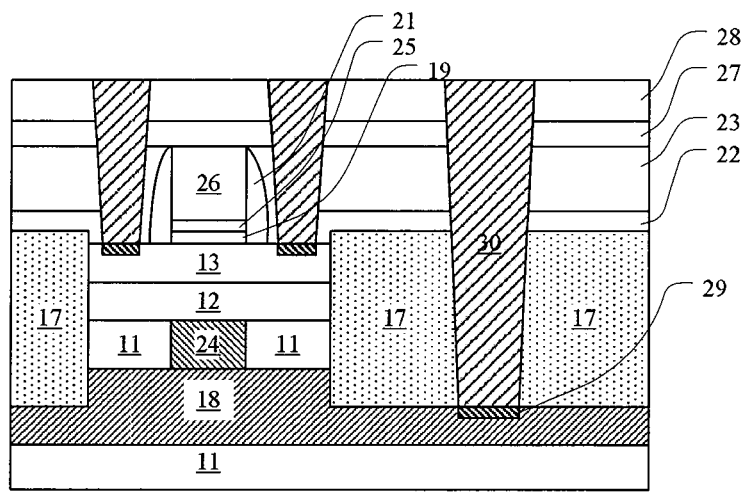

The via holes are then filled with a conductive material. The portion of the conductive material outside of the via holes is removed by CMP so that the remaining portions of the conductive material in the via holes form conductive vias 30 which are electrically connected to the source/drain regions and the back gate, as shown in FIG. 13. The conductive vias 30 contact the silicides 29 at the top surfaces of the first doped region 18 of the back gate and the source and drain regions to reduce electrical resistance. The conductive material can be but not limited to Cu, Al, W, polysilicon and other similar conductive materials.

The resultant MOSFET is shown in FIG. 13. The structures, materials and methods for various parts in the embodiment of the MOSFET are similar to those having been described for the embodiments of the method for manufacturing the MOSFET. Detailed description is omitted here for simplicity.

Figure 14:
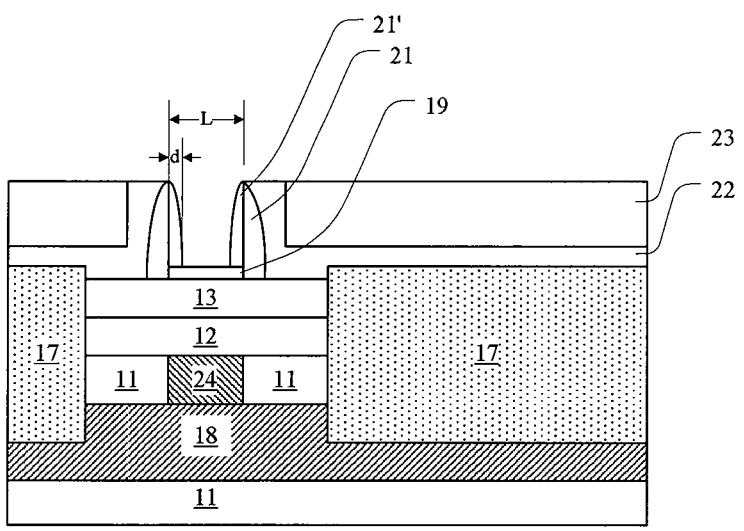
FIGS. 14-16 schematically show cross-sectional views of the semiconductor structure at some additional stages in a second embodiment of the method for manufacturing a MOSFET according to the present disclosure.
Figure 15:
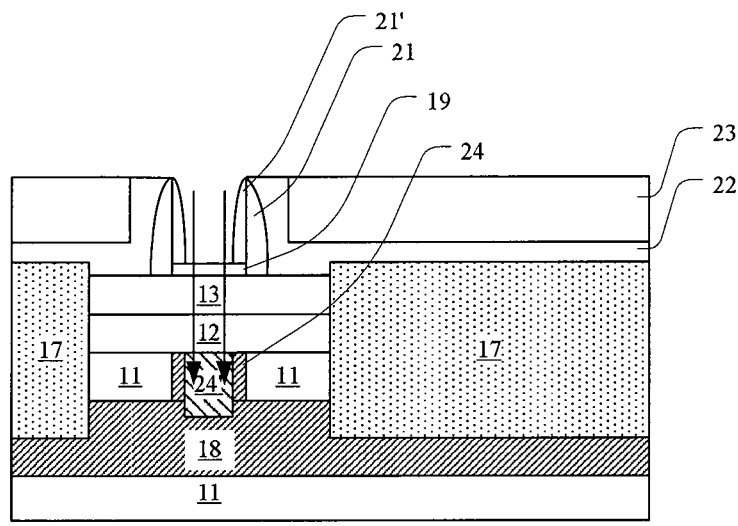
Figure 16:
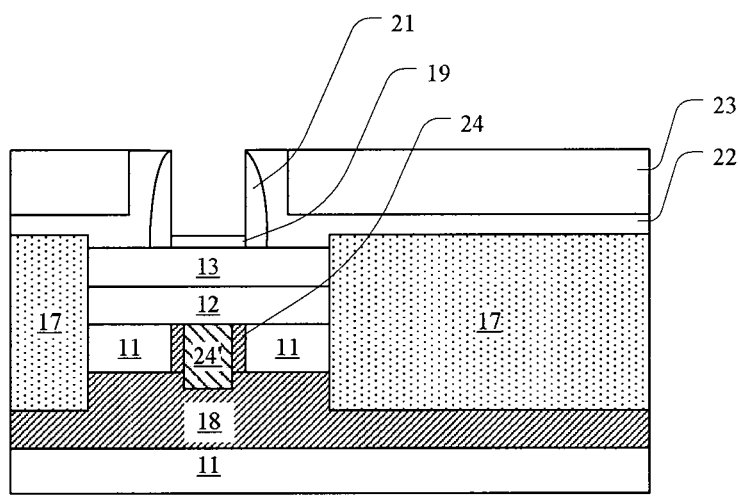

According to the second embodiment of the present disclosure, the steps shown in FIGS. 14 to 16 are performed after the steps shown in FIGS. 1-8 for manufacturing the MOSFET.

An auxiliary mask layer is formed on the whole surface of the semiconductor structure. The auxiliary mask layer may be an amorphous silicon layer having a thickness d of about 5 nm to about 15 nm, and may be formed at a temperature of about 300° C. to about 400° C. For a semiconductor device having a large gate length (relatively, the gate length L>2d), the amorphous silicon layer covers the sidewalls and the bottom of the gate opening. Next, an anisotropic etching (for example, RIE) may be performed on the amorphous silicon layer without any mask. Not only the portion of the amorphous silicon outside of the gate opening is removed, but also the portion of the amorphous silicon at the bottom of the gate opening is removed. The remaining portions of the amorphous silicon layer on the inner wall of the gate opening form sidewall spacers 21'. The sidewall spacers 21' reduce a width of the gate opening. The reduced width I of the gate opening satisfies the condition I=L−2d approximately, as shown in FIG. 14. For a semiconductor device having a small gate length (relatively, the gate length L<2d), the auxiliary mask layer has a thickness d and thus fills up the gate opening (note shown).

Next, a reverse ion implantation is performed with the gate opening as a window to form an anti-doped region 24' in the semiconductor substrate 11, as shown in FIG. 15.

A type of the dopants in the reverse ion implantation is opposite to that of the dopants in the first ion implantation for the back gate shown in FIG. 4 and the second ion implantation for the back gate shown in FIG. 8. By controlling power and dose for the ion implantation, the reverse ion implantation may be performed at a depth approximately equal to that for the second ion implantation for the back gate. In this embodiment, the dose for the reverse ion implantation is about $1\times10^{13}$ cm$^{-2}$ to about $1\times10^{15}$ cm$^{-2}$. As a result, the anti-doped region 24' is located below the channel region, has a depth approximately equal to that of the second doped region 24, and is located between two portions of the second doped region 24. Note that the anti-doped region 24' may extend downward and into the first doped region 18, but not through the first doped region 18.

After forming the anti-doped region 24', an effective doping concentration of the portion of the back gate below the channel region decreases distinctly because the type of the dopants in the reverse ion implantation is opposite to that of the dopants in the first ion implantation for the back gate and the second ion implantation for the back gate.

Alternatively, the anti-doped region 24' may have an inverse doping type, in view of the design requirement of the semiconductor device. That is, the dopants in the reverse ion implantation have a doping type opposite to that of the dopants in the first ion implantation for the back gate and in the second ion implantation for the back gate, and has a dose high sufficient for inversing the doping type of the anti-doped region 24' to be opposite to that of the first doped region 18 of the back gate and that of the second doped region 24 of the back gate.

Therefore, the anti-doped region 24' is used for adjusting a doping profile of the portion of the back gate below the channel region, which facilitates flexibly adjusting the threshold voltage of the semiconductor device. The anti-doped region 24' is formed in a self-aligned manner and is located just below the channel region and adjusts the doping profile of the back gate.

In this embodiment, the doping type of the first doped region 15 and the second doped region 24 of the back gate is opposite to the type of the MOSFET, in order to increase the threshold voltage of the MOSFET. The doping type of the anti-doped region 24' is the same as that of the first doped region 18 and the second doped region 24 of the back gate. However, the anti-doped region 24' has a doping concentration smaller than that of the first doped region 18 and the second doped region 24 of the back gate. For example, the first doped region 18 and the second doped region 24 may each have a doping concentration of about $1 \times 10^{17}$ cm$^{-3}$ to about $1 \times 10^{20}$ cm$^{-3}$, and the anti-doped region 24 may have a doping concentration of about $1 \times 10^{15}$ cm$^{-3}$ to about $1 \times 10^{18}$ cm$^{-3}$.

Due to the auxiliary mask layer having been formed, the anti-doped region 24' is formed through the gate opening having a reduced width during the reverse ion implantation, only for the semiconductor device having a large gate length. However, the auxiliary mask layer blocks implanted ions in the semiconductor device having a small gate length. The implanted ions either cannot penetrate the auxiliary mask layer, as a result of which no anti-doped region is formed in the portion of the back gate below the channel region, or partially penetrate the auxiliary mask layer. In the latter case, the effective doping concentration is approximately equal to an initial doping concentration of the second doped region minus the penetrated portion of the ions in the reverse ion implantation. Consequently, the doping concentration of the anti-doped region 24' in the semiconductor device having a small gate length is higher than that in the semiconductor device having a large gate length, which facilitates suppressing the short channel effects. Thus, the threshold voltage of the semiconductor device having a small channel length is adjusted in a way different from the semiconductor device having a large gate length.

In an alternative embodiment, the anti-doped region 24' may be located inside the back gate, at a distance from the channel region. Such an arrangement has a beneficial effect of minimizing possibility of performance deterioration of the semiconductor device, because fewer implanted ions remain in the channel region in the reverse ion implantation.

Next, an anneal is performed for a short time, for example, by using laser, electron beam or infrared radiation, so as to repair damages in the lattice and activate the implanted dopants in the anti-doped region 24'. Due to the anneal for the ion implantation, the implanted dopants diffuses again. However, the anti-doped region 24' includes the dopants having an opposite doping type, and thus has a doping concentration varying abruptly at its interface with the back gate.

A short channel (not shown) is formed in the portion of the semiconductor layer 13 above the anti-doped region 24'. Compared with a typical long channel, the short channel receives a smaller dose of dopants.

Next, the sidewall spacers 21' are selectively removed by wet etching, as shown in FIG. 16.

The above method step may be followed by the steps shown in FIGS. 9-13 for the first embodiment.

While the disclosure has been described with reference to specific embodiments, the description is illustrative of the disclosure. The description is not to be considered as limiting the disclosure. The description is not to be considered as limiting the disclosure.

We claim:

1. A MOSFET, comprising
   an SOI wafer comprising a semiconductor substrate, a buried insulating layer on the semiconductor substrate, and a semiconductor layer on the buried insulating layer;
   a gate stack on the semiconductor layer;
   a source region and a drain region in the semiconductor layer on both sides of the gate stack;
   a channel region in the semiconductor layer and located between the source region and the drain region; and
   a back gate located in the semiconductor substrate, the back gate having three regions including a first doped region as a lower portion of the back gate electrically connected to at least one conductive via, a second doped region as an upper portion of the back gate, and an anti-doped region in the second doped region of the back gate below the channel region,
   wherein the second doped region of the back gate is self-aligned with the gate stack;
   wherein the anti-doped region is self-aligned with the gate stack, and wherein an interface between the anti-doped region and the second doped region has a distance to outer side surfaces of the second doped region.

2. The MOSFET according to claim 1, wherein the back gate has a doping type the same as or opposite to the type of the MOSFET.

3. The MOSFET according to claim 1, wherein the back gate has a doping concentration of about $1 \times 10^{17}$ cm$^{-3}$ to about $1 \times 10^{20}$ cm$^{-3}$.

4. The MOSFET according to claim 1, wherein the second doped region of the back gate adjoins the buried insulating layer.

5. The MOSFET according to claim 1, wherein the antidoped region has a doping type the same as or opposite to the type of the MOSFET.

6. The MOSFET according to claim 1, wherein the antidoped region has a doping concentration lower than that of the back gate.

7. The MOSFET according to claim 6, wherein the anti-doped region has a doping concentration of about $1 \times 10^{15}$ cm$^{-3}$ to about $1 \times 10^{18}$ cm$^{-3}$.

8. The MOSFET according to claim 6, wherein the distance increases with reduction of the gate length.

\* \* \* \* \*